United States Patent
Song et al.

(10) Patent No.: US 9,691,868 B2
(45) Date of Patent: Jun. 27, 2017

(54) MERGING LITHOGRAPHY PROCESSES FOR GATE PATTERNING

(71) Applicant: QUALCOMM Incorporated, San Diego, CA (US)

(72) Inventors: Stanley Seungchul Song, San Diego, CA (US); Zhongze Wang, San Diego, CA (US); Choh Fei Yeap, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 85 days.

(21) Appl. No.: 14/283,168

(22) Filed: May 20, 2014

(65) Prior Publication Data

US 2015/0145070 A1 May 28, 2015

Related U.S. Application Data

(60) Provisional application No. 61/908,007, filed on Nov. 22, 2013.

(51) Int. Cl.
*H01L 29/423* (2006.01)
*G03F 7/20* (2006.01)
(Continued)

(52) U.S. Cl.
CPC ...... *H01L 29/4238* (2013.01); *G03F 7/70466* (2013.01); *H01L 21/28123* (2013.01);
(Continued)

(58) Field of Classification Search
CPC .......... H01L 21/28123; H01L 27/0886; H01L 27/0207; H01L 21/823437; H01L 29/4238; G03F 7/70466
(Continued)

(56) References Cited

U.S. PATENT DOCUMENTS

2002/0068447 A1 6/2002 Moon
2010/0164614 A1 7/2010 Hou et al.
(Continued)

FOREIGN PATENT DOCUMENTS

WO 2013085389 A2 6/2013
WO 2013101108 A1 7/2013

OTHER PUBLICATIONS

Chen F.T., et al., "Sidewall Profile Inclination Modulation Mask (SPIMM): Modification of an Attenuated Phase-Shift Mask for Single-Exposure Double and Multiple Patterning," Proceedings of SPIE, 2013, vol. 8683, pp. 868311-1 to 868311-12.
(Continued)

*Primary Examiner* — Hrayr A Sayadian
(74) *Attorney, Agent, or Firm* — Qualcomm Incorporated/Seyfarth

(57) ABSTRACT

Methods for fabricating devices on a die, and devices on a die. A method may include patterning a first region to create a first gate having a first gate length and a first contacted polysilicon pitch (CPP) with a first process. The first CPP is smaller than a single pattern lithographic limit. The method also includes patterning the first region to create a second gate having a second gate length or a second CPP with a second process. The second CPP is smaller than the single pattern lithographic limit. The second gate length is different than the first gate length.

11 Claims, 14 Drawing Sheets

(51) Int. Cl.
  *H01L 21/8234*  (2006.01)
  *H01L 27/02*  (2006.01)
  *H01L 21/28*  (2006.01)
  *H01L 27/088*  (2006.01)

(52) U.S. Cl.
  CPC .. *H01L 21/823437* (2013.01); *H01L 27/0207* (2013.01); *H01L 27/0886* (2013.01)

(58) Field of Classification Search
  USPC .......................................... 257/401; 438/694
  See application file for complete search history.

(56) References Cited

U.S. PATENT DOCUMENTS

| | | |
|---|---|---|
| 2011/0059403 A1 | 3/2011 | Sukekawa |
| 2012/0164837 A1 | 6/2012 | Tan et al. |
| 2012/0180016 A1 | 7/2012 | Chidambaram et al. |
| 2013/0236836 A1 | 9/2013 | Sun et al. |
| 2015/0145070 A1* | 5/2015 | Song ................. H01L 21/28123 257/401 |

OTHER PUBLICATIONS

International Search Report and Written Opinion—PCT/US2014/062276—ISA/EPO—Jan. 13, 2015.
Lars L. et al.,, "A Designer's Guide to Subresolution Lithography: Enabling the Impossible to Get to the 14-nm Node [Tutorial]", Jun. 2013 , vol. 30, No. 3, 70-92.

\* cited by examiner

MERGING LITHOGRAPHY PROCESSES FOR GATE PATTERNING

CROSS-REFERENCE TO RELATED APPLICATION

This application claims the benefit under 35 U.S.C. §119 (e) to U.S. Provisional Patent Application No. 61/908,007 entitled "MERGING LITHOGRAPHY PROCESSES FOR GATE PATTERNING," filed on Nov. 22, 2013, the disclosure of which is expressly incorporated by reference herein in its entirety.

BACKGROUND

Field

Aspects of the present disclosure relate to semiconductor devices, and more particularly to reducing gate length and spacing in field effect transistor (FET) structures.

Background

As semiconductor device sizes decrease, the ability to create the patterns for the devices becomes more difficult. For 10 nanometer (nm) contacted polysilicon (PO) pitch (CPP) devices, multiple patterning steps may be used to attain the device size. For example, a related art method is known as litho-etch (LELE), which uses a larger pitch pattern that is interleaved or intertwined to achieve smaller pitch sizes. Nevertheless, LELE is still limited by a larger line edge roughness (LER), a larger gate-gate space variation, and a larger critical dimension variation.

Another related art method is self-aligned double patterning (SADP) that uses a spacer deposited on a mandrel to define the gate length (Lg). Although SADP has better critical dimension uniformity than LELE, additional masks are used to produce different gate lengths in a SADP-produced device. This limits the usefulness of the SADP process for larger integrated circuits.

SUMMARY

A method for fabricating devices on a die may include patterning a first region to create a first gate having a first gate length and a first contacted polysilicon pitch (CPP) with a first process. The first CPP is smaller than a single pattern lithographic limit. The method also includes patterning the first region to create a second gate having a second gate length or a second CPP with a second process. The second CPP is smaller than the single pattern lithographic limit. The second gate length is different than the first gate length.

An apparatus may include a first gate length device having a first gate length and a first contacted polysilicon pitch (CPP) in a first region. The first CPP is smaller than a single pattern lithographic limit. The apparatus also includes at least one second gate length device in the first region having a second gate length or a second CPP. The second CPP is smaller than the single pattern lithographic limit. The second gate length being different than the first gate length.

An apparatus may include first means for selectively conducting current having a first gate length and a first contacted polysilicon pitch (CPP) in a first region. The first CPP is smaller than a single pattern lithographic limit. The apparatus also includes second means for selectively conducting current having at least one second gate length device having a second gate length or a second CPP. The second CPP is smaller than the single pattern lithographic limit. The second gate length being different than the first gate length.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 2A-2M illustrate a process to fabricate a semiconductor device in accordance with one or more aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

A ten (10) nanometer (nm) contacted polysilicon (PO) pitch (CPP) geometry may use a sixty (64) nm base geometry for patterning of the devices. To create this size of a base geometry in a device, 193 interleaved double patterning is often used. Two methods can create the base geometry in the device. The first lithography process, litho-etch (LELE), uses a one hundred twenty-eight (128) nm pitch pattern that is interleaved (e.g., overlaid) upon itself to reduce the size of the 128 nm features to the 64 nm features. By overlapping the mask, the 128 nm features can be cut in half to get to the 64 nm base CPP. The second lithography process, self-aligned double patterning (SADP), uses a spacer deposited to a dummy mandrel pattern to define the gate length (Lg). This is similar to creating a fin structure in a FinFET device.

One aspect of the present disclosure merges SADP and LELE to allow for multiple gate lengths within a circuit or device. The use of SADP provides tighter critical dimension (CD) control and less variation, but only allows for a single gate length. One mask is used for the SADP process in an aspect of the present disclosure. The use of LELE provides for multiple gate lengths and a flexible CPP within the same device. The use of LELE, in an aspect of the present disclosure, uses two masks. The cut pattern for both SADP and LELE also uses a single mask, in an aspect of the present disclosure, which provides for a four mask process.

The use of SADP, in an aspect of the present disclosure, enables a smaller gate length at a smaller CPP. By combining SADP with LELE, multiple gate lengths at a smaller, possibly minimum CPP are enabled. Further, LELE also allows for larger gate lengths at a larger CPP for input-output (I/O) and analog devices.

Figure 1A:
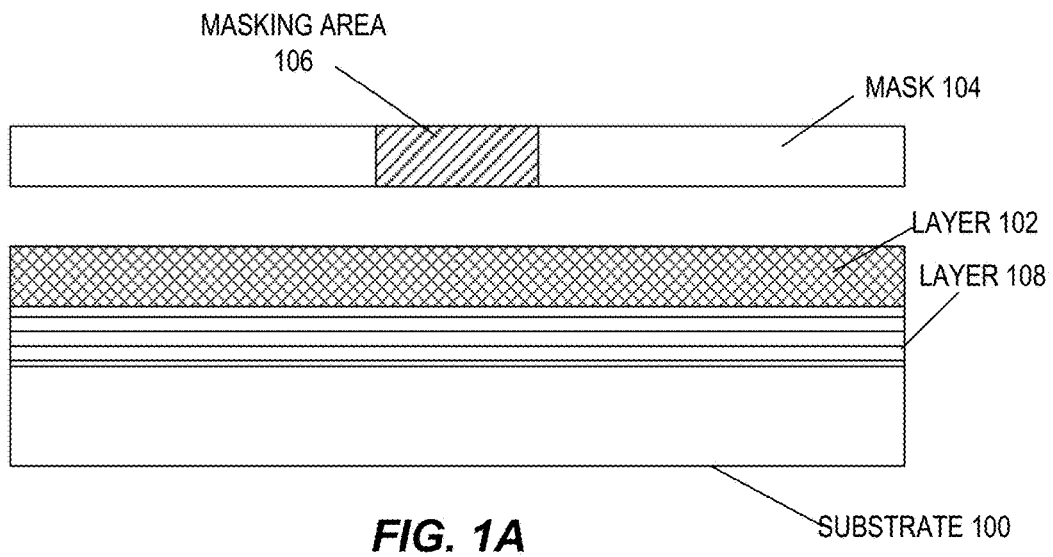
FIGS. 1A-1J illustrate side views of a semiconductor device in accordance with one or more aspects of the present disclosure.
Figure 1B:
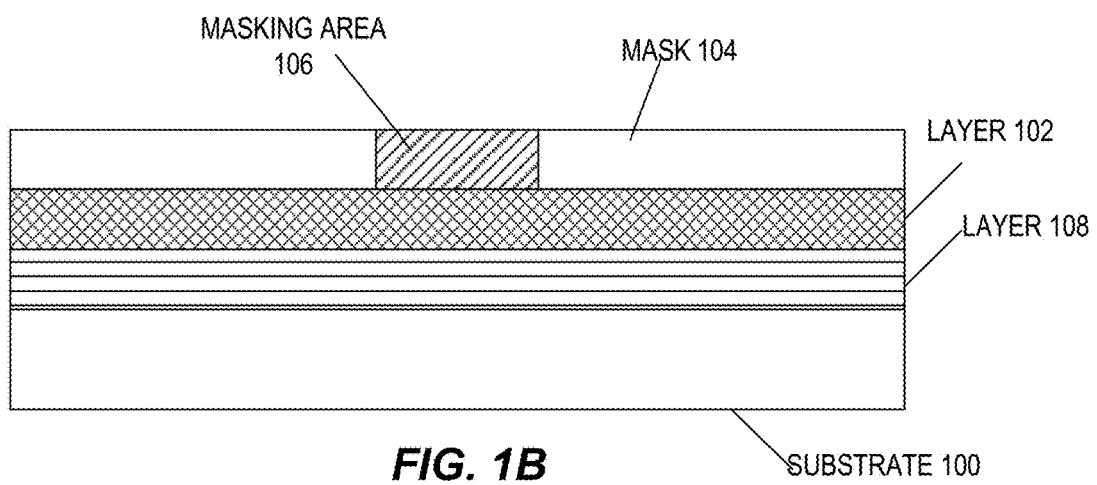

FIGS. 1A-1J illustrate side views of a semiconductor device in accordance with one or more aspects of the present disclosure. In FIGS. 1A-1J, the LELE process is generally shown. FIG. 1A illustrates a substrate 100 with a layer 102 and a layer 108. The layers 102 and 108 may be hard mask layers, layers of photoresist, or may be layers of silicon oxide, polysilicon, or other materials. A mask 104, with a masking area 106, is also shown in FIG. 1A. In FIG. 1B, the mask 104 is placed proximate to the layer 102 and the substrate 100, in order to pattern the layer 102.

Figure 1C:
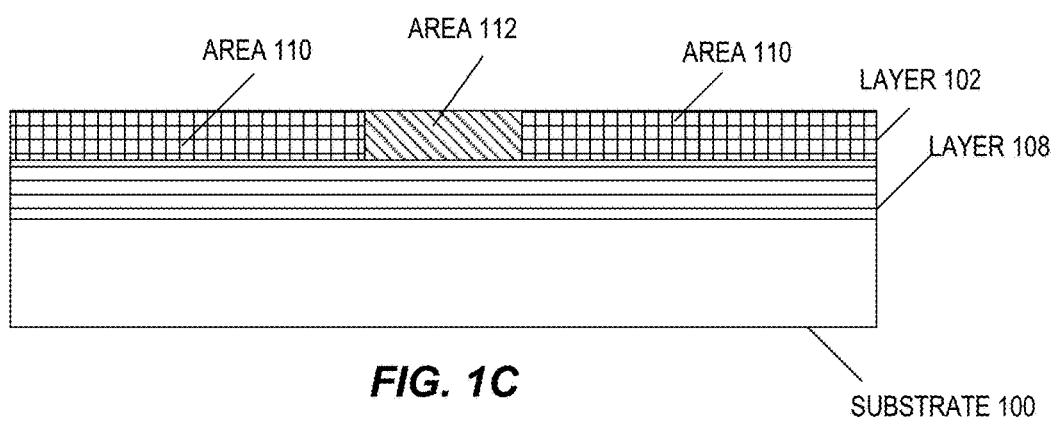
Figure 1D:
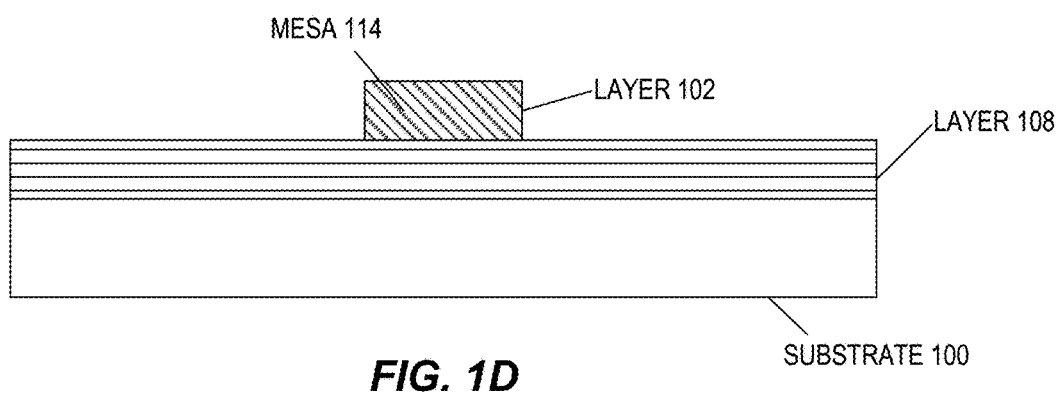

FIG. 1C illustrates the layer 102 with areas 110 of the layer 102 that were not shielded by the masking area 106, and the area 112 that was shielded by the masking area 106. FIGS. 1A-1C describe the "first lithography" or "first litho" portion of the LELE process of the present disclosure. FIG. 1D illustrates a mesa 114, which may be part of the layer 102, or may be part of another layer depending on the design of the overall device. FIG. 1D describes the "first etch" of the LELE process of the present disclosure.

Figure 1E:
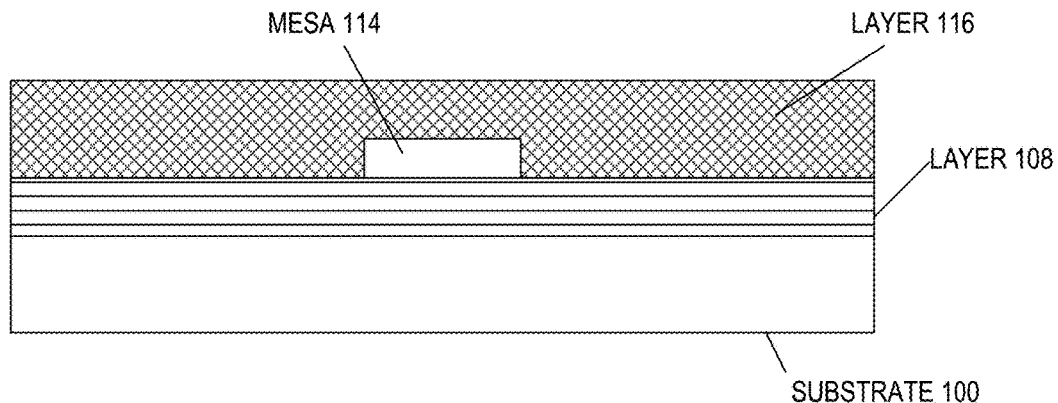
Figure 1F:
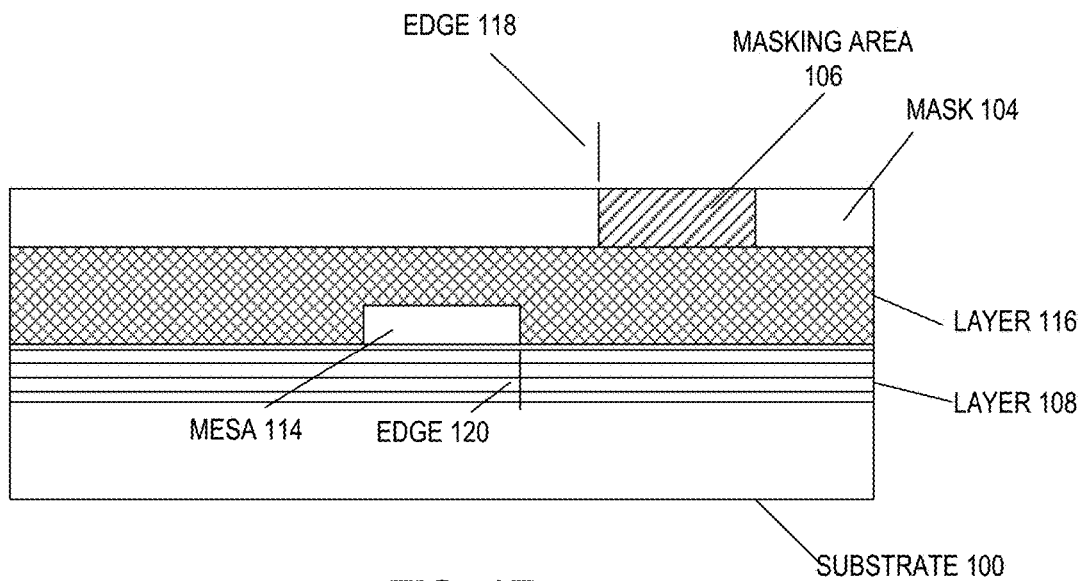
Figure 1G:
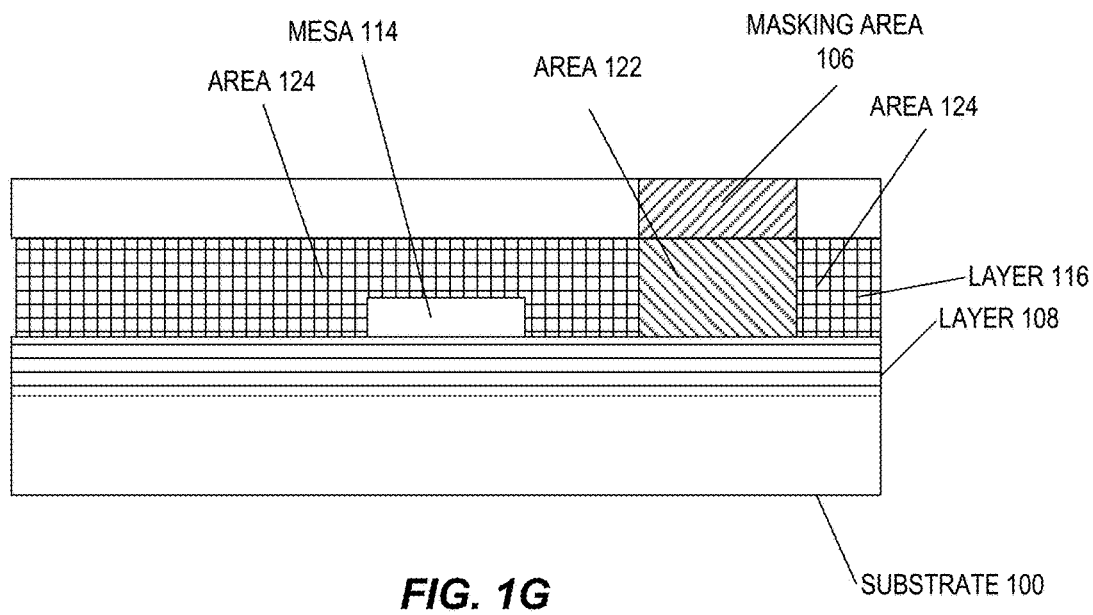
Figure 1H:
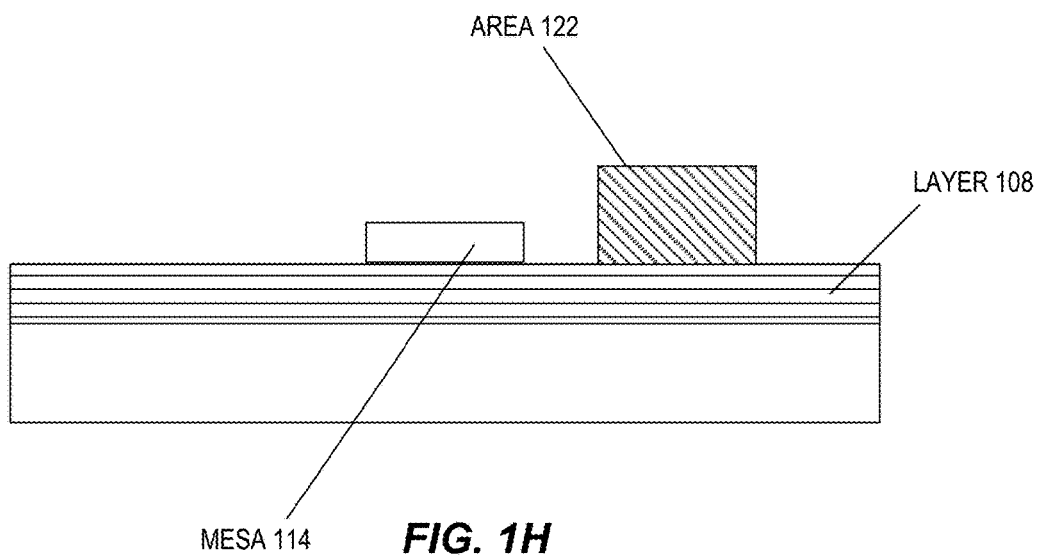

FIG. 1E illustrates another layer 116, which may be photoresist, or may be silicon, silicon oxide, polysilicon, or other materials. FIG. 1F illustrates the mask 104, where an edge 118 of the masking area 106 is offset from an edge 120 of the mesa 114. FIG. 1G illustrates the exposure of the layer 116, where an area 122 is shielded using the masking area 106, while areas 124 remain unshielded. FIG. 1H shows the area 122 and the mesa 114 on the layer 108. FIGS. 1E-1H describe the "second lithography" portion of the LELE process of the present disclosure.

Figure 1I:
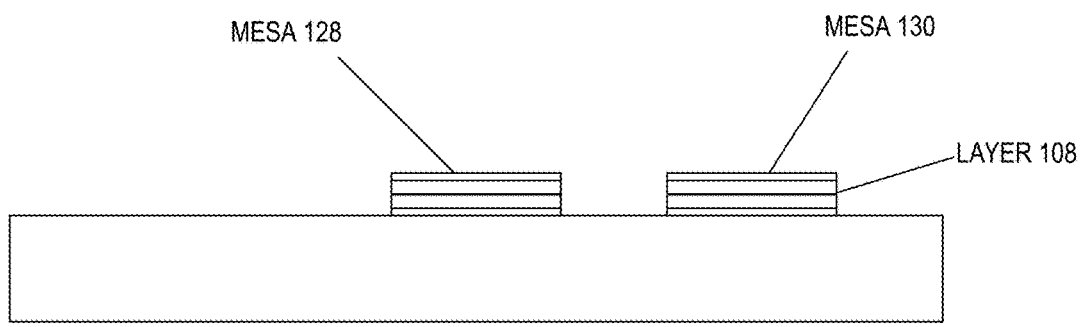
Figure 1J:
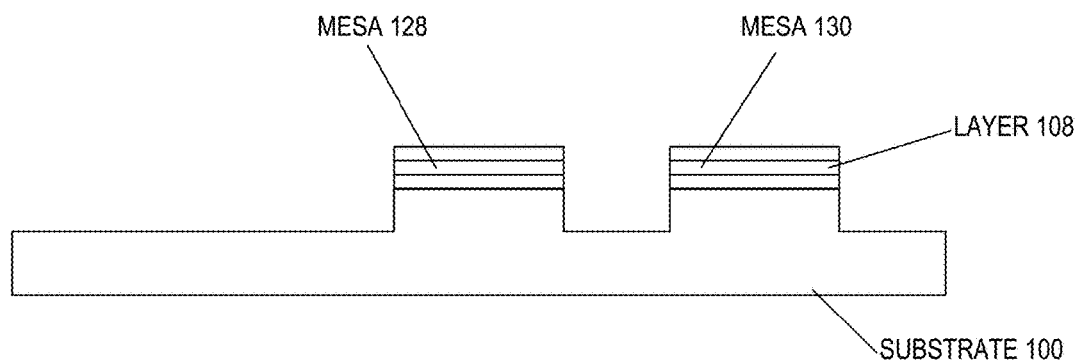

FIG. 1I illustrates etching or removal of portions of the layer 108, to create a mesa 128 and a mesa 130 that were underneath the mesa 114 and the area 122. FIG. 1J illustrates etching the substrate 100, where the mesas 128 and 130 act as a mask to protect portions of the substrate 100. FIGS. 1H-1J describe the "second etch" portion of the LELE process of the present disclosure.

By positioning the masking area 106, the widths of the mesas 128 and 130, and thus the features that are created on the substrate 100 or other layers in the device, are created by "interleaving" the masking areas 106 between the first lithography and the second lithography in the LELE process.

The area 122 (which is defined by the masking area 106), however, limits how close the mesa 130 can be to another mesa 128 or another device, because the area 122 prevents any etching or other processing from occurring underneath the area 122. This limits the gate-to-gate spacing of devices on the substrate 100. In other words, the LELE process may be performed in a first region and the SADP process may be performed in a second region. Further, the LELE process may be performed in between features or gates produced by the SADP process.

FIGS. 2A-2M illustrate a process to fabricate a semiconductor device in accordance with one or more aspects of the present disclosure.

Figure 2C:
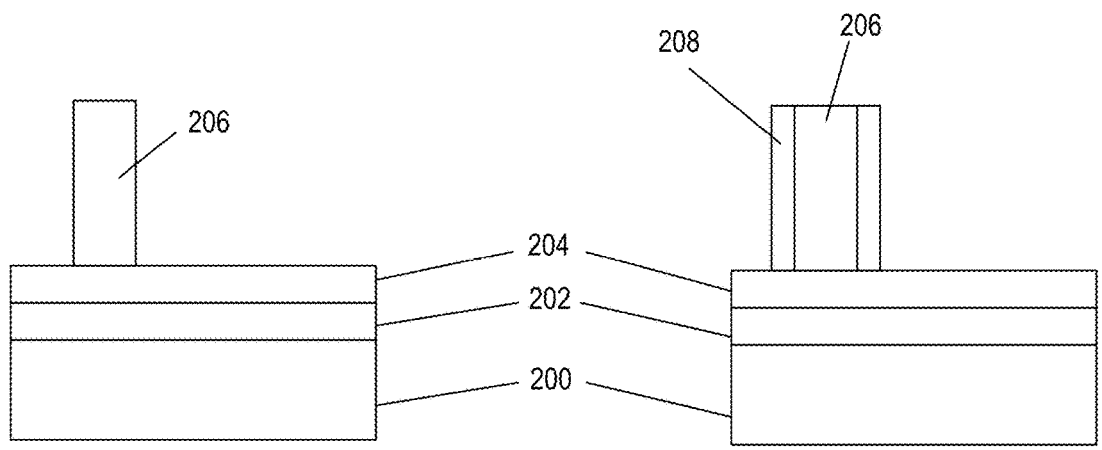
Figure 2C:
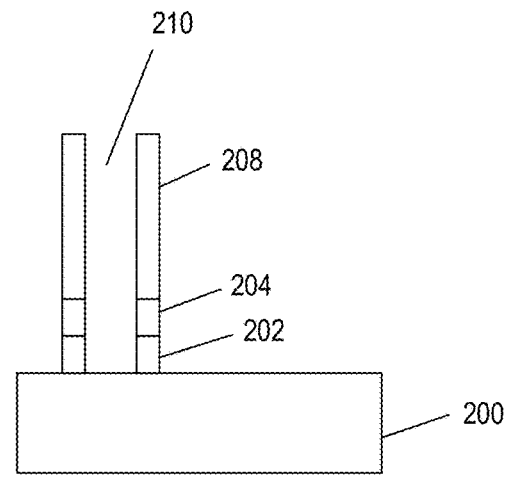
Figure 2F:
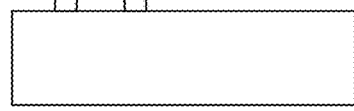
Figure 2F:
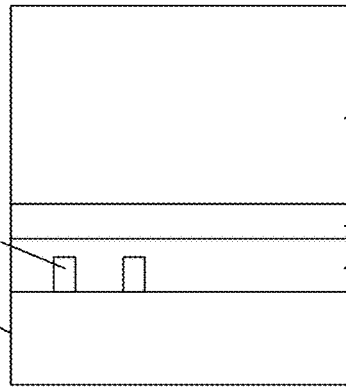
Figure 2F:
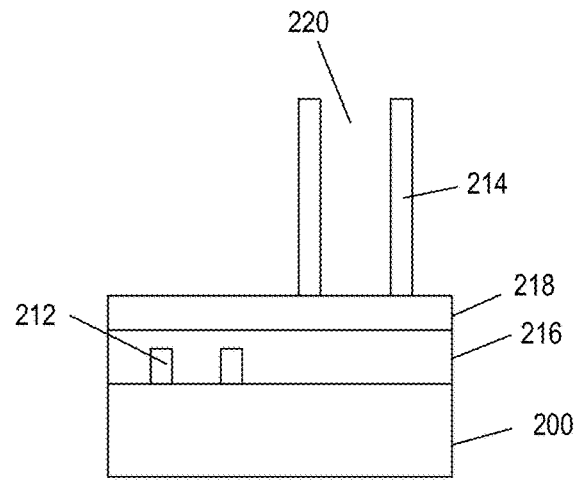

FIG. 2A illustrates the use of an SADP mask. A substrate 200 with hard mask layers 202 and 204 are shown, and a mandrel 206 is deposited on the hard mask layer 204. FIG. 2B illustrates the deposition of a spacer layer 208 on the mandrel 206. FIG. 2C illustrates etching 210 of the mandrel 206 and the hard mask layers 202 and 204. The spacer layer 208 thickness define a gate length in the SADP process. FIG. 2D shows the spacer layer 208 and the hard mask layer 204 being removed, leaving a gate length pattern 212 on the substrate 200. FIG. 2E shows deposition of a photoresist (PR) layer 214 and hard mask layers 216, 218. The second mask is applied and the photoresist layer 214 is exposed or patterned 220 in FIG. 2F, which is the first LELE pattern.

In the present disclosure, the SADP mask creates a pattern of first gates in a first region of the substrate 200, and the LELE patterning is performed in the first region of the substrate 200. As such, in an aspect of the present disclosure, the SADP devices and the LELE devices may be interleaved or adjacent to one another in the first region of the substrate 200.

Further, the SADP patterns in the first region create a first gate length and a first contacted polysilicon pitch (CPP). The first CPP may be smaller than a single pattern lithographic limit. The LELE patterns in the first region create a second gate length or a second CPP, where the second CPP is also smaller than the single pattern lithographic limit. The second gate length may be different than the first gate length. As an example, and not by way of limitation, the first and second CPP may range between 40 and 80 nanometers, while the first and second gate length may range between 10 and 30 nanometers.

Figure 2G:
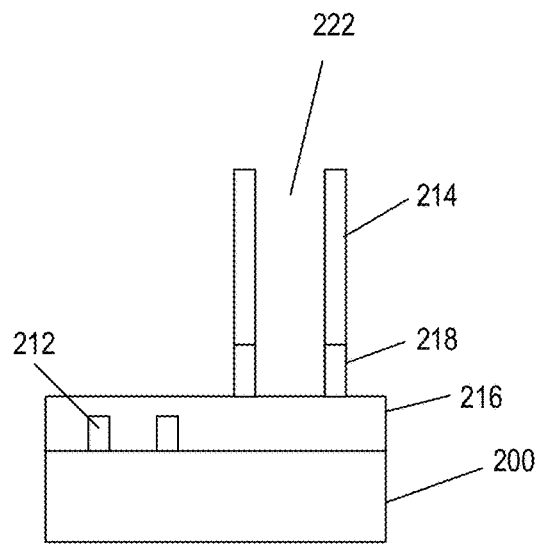
Figure 2H:
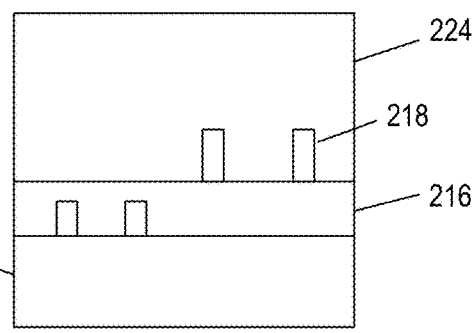
Figure 2I:
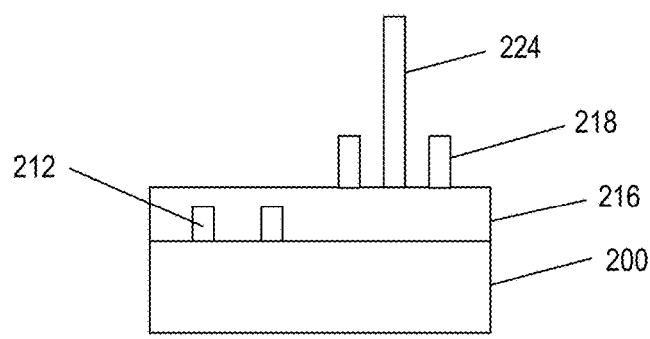
Figure 2J:
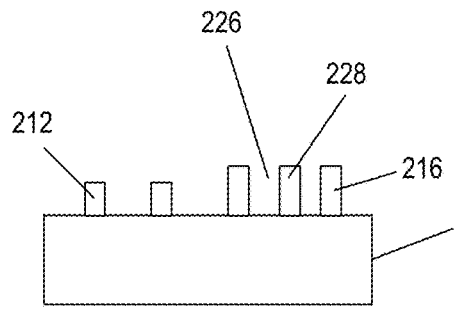
Figure 2K:
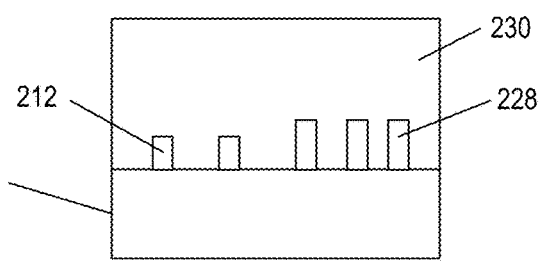
Figure 2L:
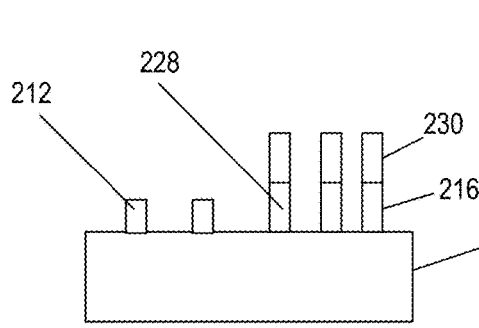
Figure 2M:
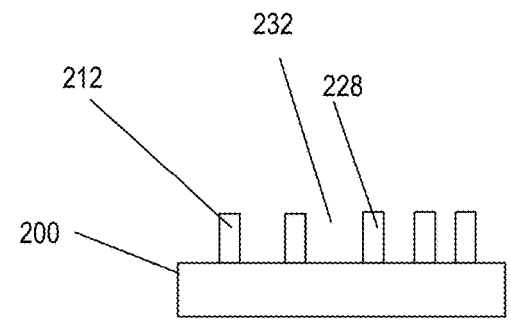

FIG. 2G illustrates the hard mask layer removal by an etch 222. FIG. 2H illustrates a second photoresist 224 application. FIG. 2I illustrates use of a third mask, the second LELE pattern, which patterns the second photoresist 224. FIG. 2J illustrates an etch 226 of the hard mask layer 216, to create a gate length pattern 228, based on the second LELE pattern. FIG. 2K illustrates another photoresist 230 deposition. FIG. 2L shows the patterning of the cut mask. FIG. 2M illustrates the etching 232 into the substrate 200 to create the gate length patterns 212 and 228 into the substrate 200 in accordance with an aspect of the present disclosure.

Figure 3A:
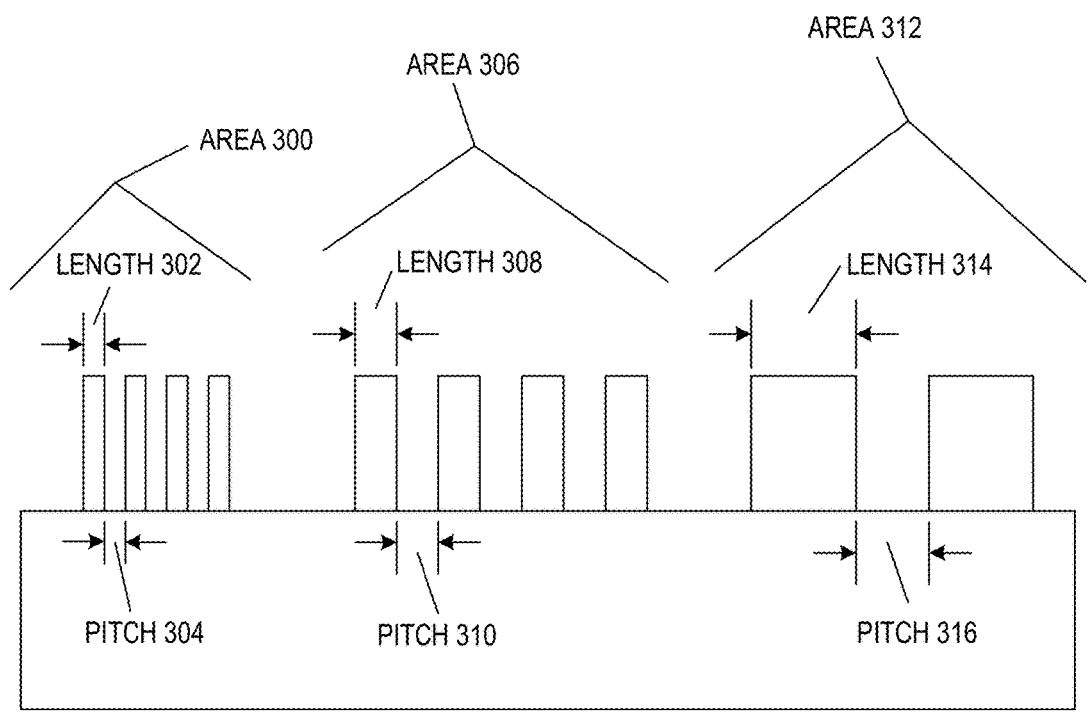
FIGS. 3A-3C illustrate side views of a semiconductor device in accordance with one or more aspects of the present disclosure.

FIG. 3A illustrates a side view of a semiconductor device in accordance with one or more aspects of the present disclosure. An area 300 shows an SADP-patterned gate length 302 at a smaller pitch (CPP) 304, which has improved critical dimension uniformity and with less pitch variation between devices. An area 306 shows a LELE patterned gate length 308 at a second pitch (CPP) 310, which may be a smaller CPP or the same CPP 310 as in the area 300. An area 312 illustrates a larger gate length 314 at a larger pitch (CPP) 316, which may be made using the LELE process described with respect to FIGS. 1A-1J.

Figure 3B:
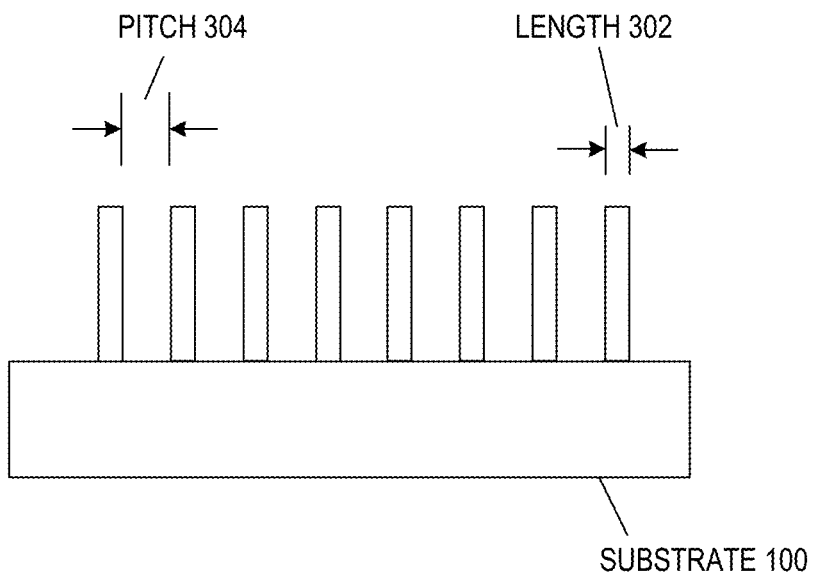
Figure 3C:
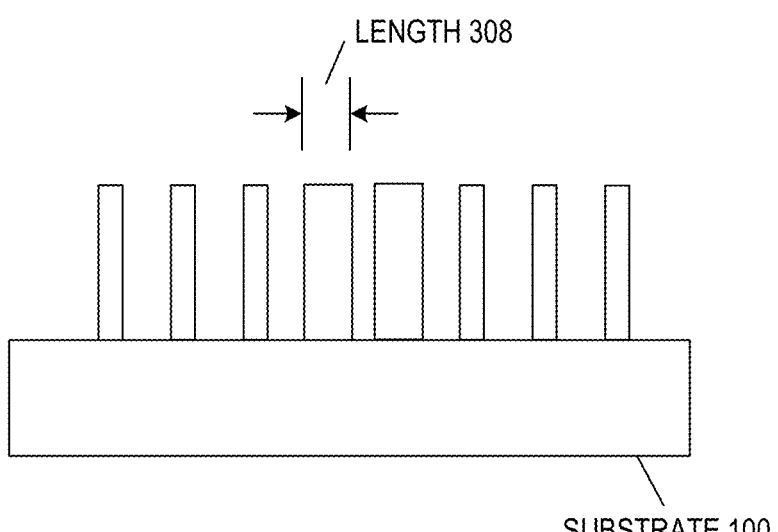

FIG. 3B illustrates a side view of a semiconductor device in accordance with one or more aspects of the present disclosure. Multiple devices are initially formed with an SADP-patterned gate length 302 at a smaller pitch (CPP) 304. In FIG. 3C, an LELE cell swap is performed within the same region or area on the substrate 100. In this aspect of the disclosure, the LELE cell swap process is performed to fabricate a pair of LELE patterned devices with a LELE patterned gate length 308 that is larger than the SADP-patterned gate length 302. The pitch for the LELE patterned gate length devices may be the same as the pitch 304.

Figure 4:
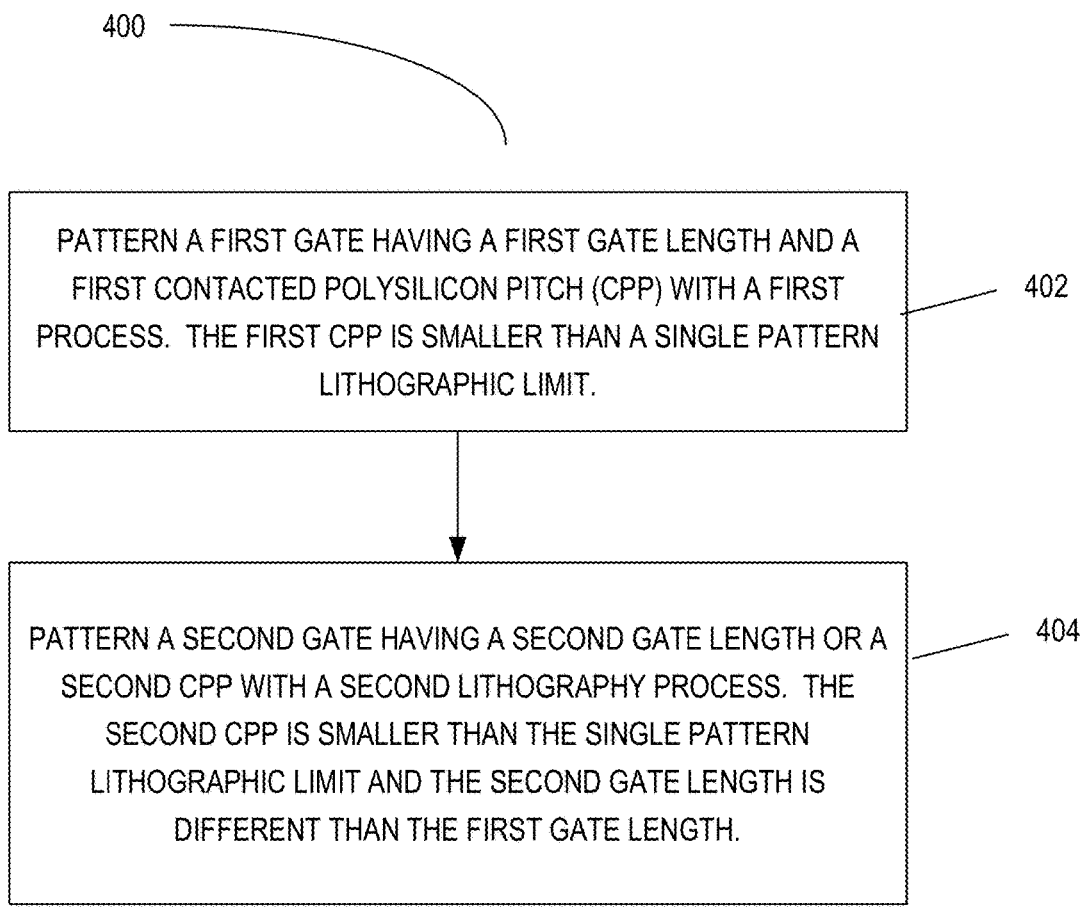
FIG. 4 is a process flow diagram illustrating a method for fabricating a device according to an aspect of the present disclosure.

FIG. 4 is a process flow diagram illustrating a method 400 for fabricating a device according to an aspect of the present disclosure. In block 402, at least a first gate having a first gate length and a first contacted polysilicon pitch (CPP) is patterned with a first lithography process. The first CPP is smaller than a single pattern lithographic limit. For example, a first gate is patterned using SADP as shown in FIGS. 1A-1J. In block 404 a second gate having a second gate length or a second CPP with a second lithography process is patterned. The second CPP is smaller than the single pattern lithographic limit and the second gate length is different than the first gate length. For example, a second gate is patterned using the LELE process in FIGS. 2A-2M.

According to a further aspect of the present disclosure, a semiconductor apparatus is described. In one configuration, the apparatus includes first means for selectively conducting current having a first gate length and a first contacted polysilicon pitch (CPP). The first means may be a transistor made using a SADP process as described in area 300 of FIG. 3. The apparatus also includes second means for selectively conducting current having at least one second gate length device having a second gate length and a second CPP. The second means may be a transistor made using a LELE process as described in area 306 or area 312 of FIG. 3. In another aspect, the aforementioned means may be any module or any apparatus configured to perform the functions recited by the aforementioned means.

Figure 5:
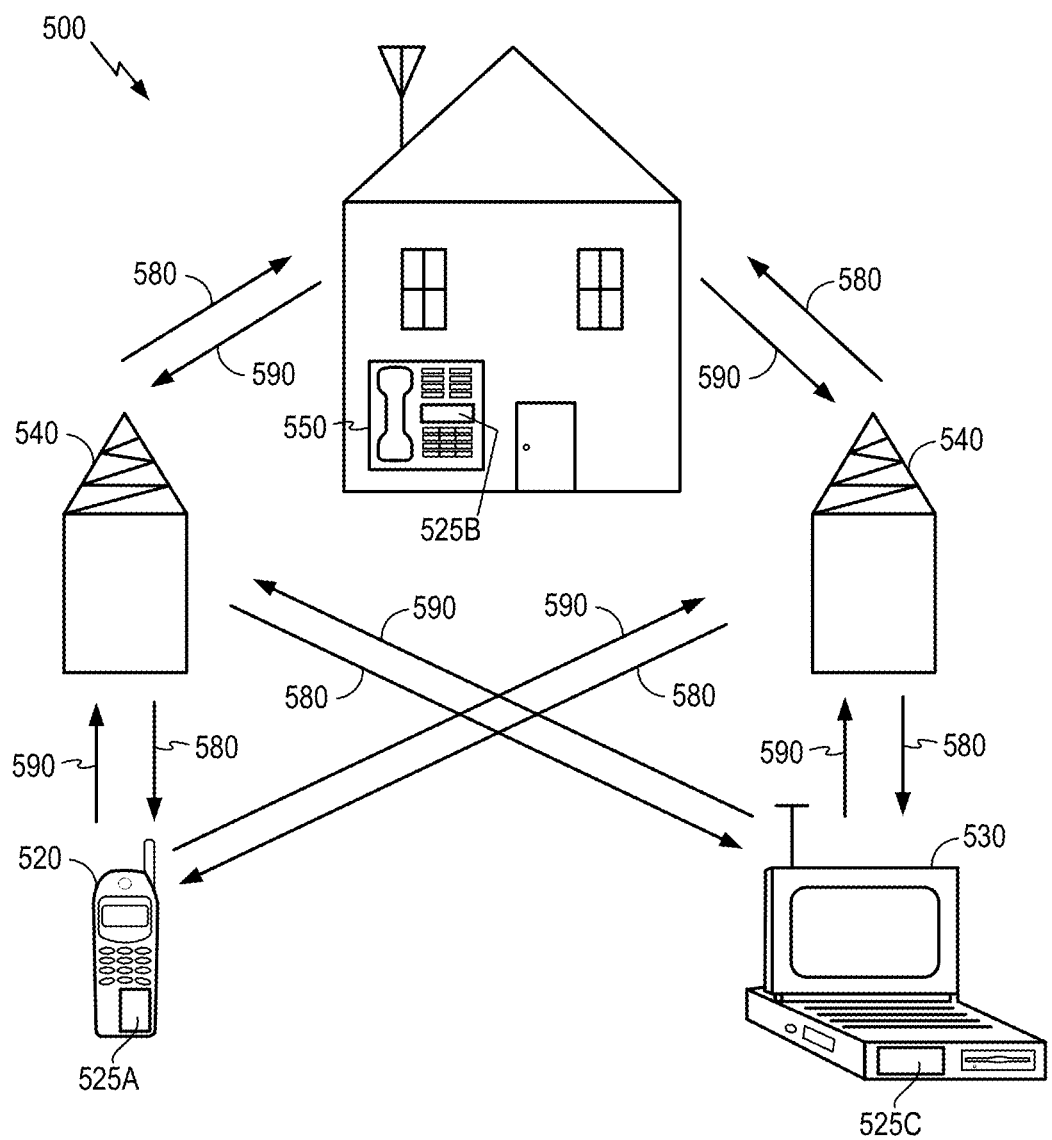
FIG. 5 is a block diagram showing an exemplary wireless communication system in which an aspect of the disclosure may be advantageously employed.

FIG. 5 is a block diagram showing an exemplary wireless communication system 500 in which an aspect of the disclosure may be advantageously employed. For purposes of illustration, FIG. 5 shows three remote units 520, 530, and 550 and two base stations 540. It will be recognized that wireless communication systems may have many more remote units and base stations. Remote units 520, 530, and 550 include IC devices 525A, 525C, and 525B that include the disclosed devices. It will be recognized that other devices may also include the disclosed devices, such as the base stations, switching devices, and network equipment. FIG. 5 shows forward link signals 580 from the base station 540 to the remote units 520, 530, and 550 and reverse link signals 590 from the remote units 520, 530, and 550 to base stations 540.

In FIG. 5, remote unit 520 is shown as a mobile telephone, remote unit 530 is shown as a portable computer, and remote unit 550 is shown as a fixed location remote unit in a wireless local loop system. For example, the remote units may be mobile phones, hand-held personal communication systems (PCS) units, portable data units such as personal data assistants, GPS enabled devices, navigation devices, set top boxes, music players, video players, entertainment units, fixed location data units such as meter reading equipment, or other devices that store or retrieve data or computer instructions, or combinations thereof Although FIG. 5 illustrates remote units according to the aspects of the disclosure, the disclosure is not limited to these exemplary illustrated units. Aspects of the disclosure may be suitably employed in many devices, which include the disclosed devices.

Figure 6:
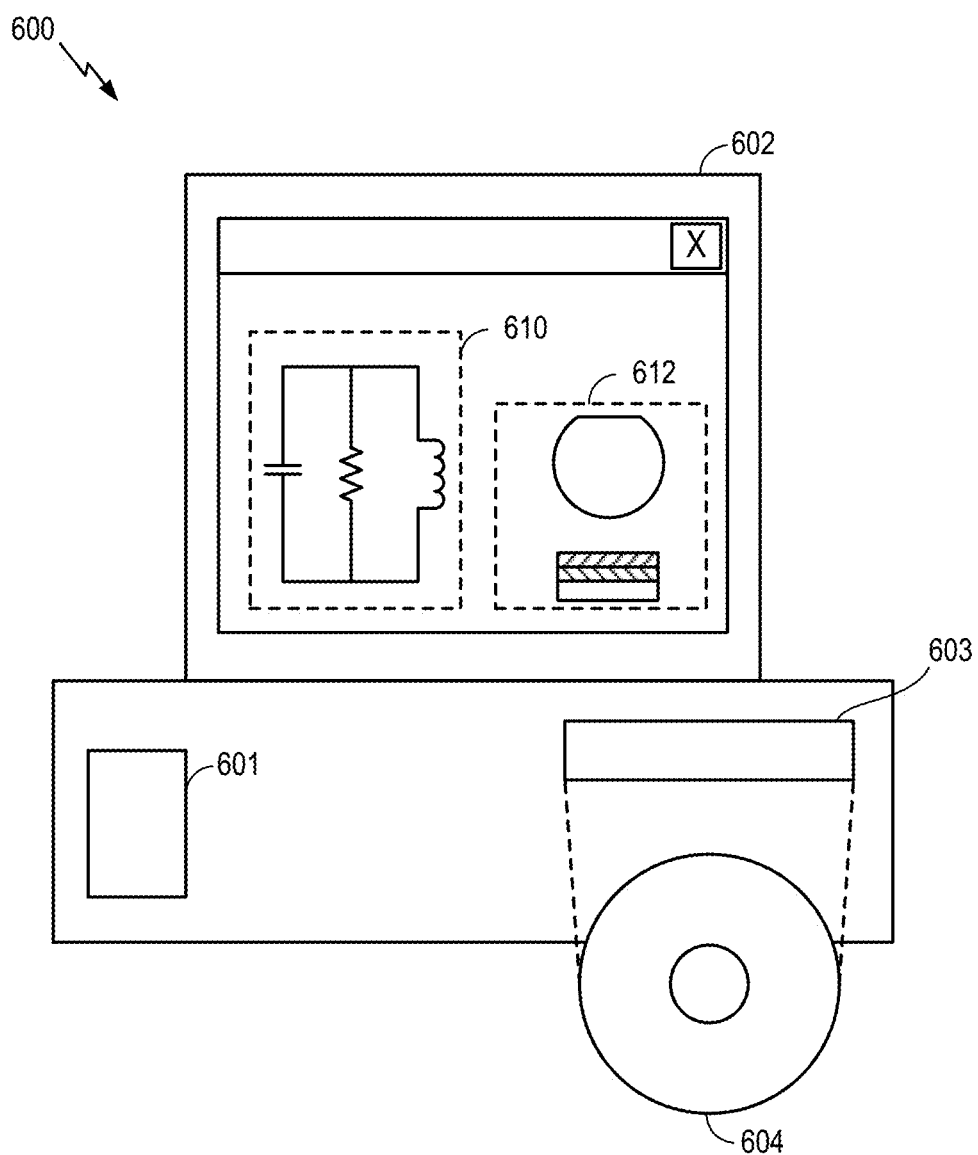
FIG. 6 is a block diagram illustrating a design workstation used for circuit, layout, and logic design of a semiconductor component in accordance with an aspect of the present disclosure.

FIG. 6 is a block diagram illustrating a design workstation used for circuit, layout, and logic design of a semiconductor component, such as the devices disclosed above. A design workstation 600 includes a hard disk 601 containing operating system software, support files, and design software such as Cadence or OrCAD. The design workstation 600 also includes a display 602 to facilitate design of a circuit 610 or a semiconductor component 612 such as a device in accordance with an aspect of the present disclosure. A storage medium 604 is provided for tangibly storing the design of the circuit 610 or the semiconductor component 612. The design of the circuit 610 or the semiconductor component 612 may be stored on the storage medium 604 in a file format such as GDSII or GERBER. The storage medium 604 may be a CD-ROM, DVD, hard disk, flash memory, or other appropriate device. Furthermore, the design workstation 600 includes a drive apparatus 603 for accepting input from or writing output to the storage medium 604.

Data recorded on the storage medium 604 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 604 facilitates the design of the circuit 610 or the semiconductor component 612 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal In one or more exemplary designs, the functions described may be implemented in hardware, software, firmware, or any combination thereof If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A method for fabricating a plurality of devices on a die, comprising:
   patterning a first region to create a plurality of first gates having a first gate length and a contacted polysilicon pitch (CPP) with a first process, the CPP being smaller than a single pattern lithographic limit;
   patterning the first region according to a cell swap process; and then
   fabricating a pair of second gates arranged in place of some of the plurality of first gates, the second pair of gates having a second gate length and the CPP, the cell swap process being different from the first process, and the second gate length being different than the first gate length.

2. The method of claim 1, in which the first process is a self-aligned double patterning (SADP) process.

3. The method of claim 2, in which the second process is a litho-etch-litho-etch (LELE) process.

4. The method of claim 1, in which the cell swap process is a second lithography process performed in between gates formed by the first process.

5. The method of claim 1, in which the plurality of devices are integrated into a mobile phone, a set top box, a music player, a video player, an entertainment unit, a navigation device, a computer, a hand-held personal communication systems (PCS) unit, a portable data unit, and/or a fixed location data unit.

6. An apparatus, comprising:
   a plurality of first gate length devices having a first gate length and a contacted polysilicon pitch (CPP) in a first region, the CPP being smaller than a single pattern lithographic limit; and
   a pair of second gate length devices arranged in place of some of the plurality of first gate length devices in the first region, the pair of second gate length devices having a second gate length and the CPP, the second gate length being different than the first gate length.

7. The apparatus of claim 6, in which the plurality of first gate length devices have a more uniform critical dimension uniformity than the pair of second gate length devices.

8. The apparatus of claim 6, further comprising a third gate length device having a third gate length.

9. The apparatus of claim 6 integrated into a mobile phone, a set top box, a music player, a video player, an entertainment unit, a navigation device, a computer, a hand-held personal communication systems (PCS) unit, a portable data unit, and/or a fixed location data unit.

10. A method for fabricating a plurality of devices on a die, comprising:
    the step of patterning a first region to create a plurality of first gates having a first gate length and a contacted polysilicon pitch (CPP) with a first process, the CPP being smaller than a single pattern lithographic limit;
    the step of patterning the first region according to a cell swap process; and then
    fabricating a pair of second gates arranged in place of some of the plurality of first gates, the second pair of gates having a second gate length and the CPP, the cell swap process being different from the first process, and the second gate length being different than the first gate length.

11. The method of claim 10, in which the plurality of devices are integrated into a mobile phone, a set top box, a music player, a video player, an entertainment unit, a navigation device, a computer, a hand-held personal communication systems (PCS) unit, a portable data unit, and/or a fixed location data unit.

* * * * *